(12) United States Patent
Nagai et al.

(10) Patent No.: US 7,279,403 B2
(45) Date of Patent: Oct. 9, 2007

(54) PLATE-LIKE WORKPIECE DIVIDING APPARATUS

(75) Inventors: Yusuke Nagai, Tokyo (JP); Satoshi Kobayashi, Tokyo (JP)

(73) Assignee: Disco Corporation, Tokyo (JP)

( * ) Notice: Subject to any disclaimer, the term of this patent is extended or adjusted under 35 U.S.C. 154(b) by 251 days.

(21) Appl. No.: 10/869,930

(22) Filed: Jun. 18, 2004

(65) Prior Publication Data

US 2004/0266094 A1    Dec. 30, 2004

(30) Foreign Application Priority Data

Jun. 27, 2003   (JP)  ............................. 2003-183795

(51) Int. Cl.
  *H01L 21/301* (2006.01)
  *H01L 21/78* (2006.01)
  *B26F 3/00* (2006.01)

(52) U.S. Cl. .................. 438/462; 438/464; 125/23.01; 125/35; 225/96.5; 225/104

(58) Field of Classification Search .................... 225/1, 225/2, 96, 96.5, 100, 103, 104; 125/13.01, 125/23.01, 35; 257/E21.214; 438/460–465
See application file for complete search history.

(56) References Cited

U.S. PATENT DOCUMENTS

| | | | | |
|---|---|---|---|---|
| 3,448,510 A | * | 6/1969 | Bippus et al. | 29/413 |
| 3,727,282 A | * | 4/1973 | Neary | 414/787 |
| 3,747,204 A | * | 7/1973 | Beavers | 29/594 |
| 3,766,638 A | * | 10/1973 | Moore | 438/464 |
| 3,790,051 A | * | 2/1974 | Moore | 225/1 |
| 4,140,260 A | * | 2/1979 | Gantley | 225/93 |
| 5,288,663 A | * | 2/1994 | Ueki | 438/460 |
| 6,297,131 B1 | | 10/2001 | Yamada et al. | 438/464 |
| 6,344,402 B1 | | 2/2002 | Sekiya | 438/460 |
| 6,345,616 B1 | * | 2/2002 | Umahashi | 125/13.01 |
| 6,513,694 B1 | * | 2/2003 | Xu et al. | 225/96.5 |
| 6,726,526 B2 | * | 4/2004 | Sekiya et al. | 451/5 |

FOREIGN PATENT DOCUMENTS

| | | |
|---|---|---|
| JP | 2002-192367 | 7/2002 |
| JP | 2002-334852 | * 11/2002 |

OTHER PUBLICATIONS

Austrian Patent Office Search Report via IPOS for Singapore patent application 200403801-4.
Austrian Patent Office Examination Report via IPOS for Singapore patent application 200403801-4.

* cited by examiner

*Primary Examiner*—Clark F. Dexter
(74) *Attorney, Agent, or Firm*—Smith, Gambrell, & Russell, LLP

(57) ABSTRACT

Disclosed herein is a dividing apparatus for dividing a plate-like workpiece, which is put on the top surface of a protective tape affixed to an annular frame and which has reduced strength along dividing lines. The apparatus includes a frame holder for holding the annular frame, a tape expander for expanding the protective tape, a detector for detecting the plate-like workpiece, a divider for pressing dividing lines to divide the workpiece into chips along the lines detected by the detector, a device for pushing up divided chips through the protective tape, and a device for picking up pushed up chips.

6 Claims, 8 Drawing Sheets

(a)

(b)

(a)

(b)

(a)

(b)

(c)

PLATE-LIKE WORKPIECE DIVIDING APPARATUS

FIELD OF THE INVENTION

The present invention relates to an apparatus for dividing a plate-like workpiece such as a semiconductor wafer along predetermined dividing lines.

DESCRIPTION OF THE PRIOR ART

In the production process of a semiconductor device, a plurality of areas are sectioned by streets (dividing lines) formed in a lattice-like form on the front surface of a substantially disk-like semiconductor wafer and a circuit such as IC or LSI is formed in each of the sectioned areas. The semiconductor wafer is cut along the dividing lines to be divided into the circuit-formed areas, thereby manufacturing individual semiconductor chips. An optical device wafer having a gallium nitride-based compound semiconductor or the like laminated on the front surface of a sapphire substrate is also cut along dividing lines to be divided into individual optical devices such as light-emitting diodes, laser diodes or the like, which are widely used in electric equipment.

Cutting the above semiconductor wafer or optical device wafer along the dividing lines is generally carried out by a cutting machine called "dicer". This cutting machine has a chuck table for holding a semiconductor wafer as a workpiece, a cutting means for cutting the semiconductor wafer held on the chuck table, and a moving means for moving the chuck table and the cutting means relative to each other. The cutting means comprises a rotary spindle that is rotated at a high speed and a cutting blade mounted to the spindle. The cutting blade comprises a disk-like base and an annular edge, which is mounted to the side wall outer periphery of the base and formed as thick as about 20 μm by fixing diamond abrasive grains having a diameter of about 3 μm to the base by electroforming.

Since a sapphire substrate, silicon carbide substrate or lithium tantalate substrate has a high Mohs hardness, cutting with the above cutting blade is not always easy. Further, since the cutting blade has a thickness of about 20 μm, the dividing line to section each device needs to have a width of about 50 μm. Therefore, in the case of a device measuring about 300 μm×300 μm for example, the area ratio of the dividing lines is large, thereby reducing productivity.

Meanwhile, as a means of dividing a plate-like workpiece such as a semiconductor wafer or the like, a laser beam processing method in which a laser beam capable of passing through a plate-like workpiece is used and the laser beam is applied to the plate-like workpiece with its converging point on the inside of its area to be divided is now undertaken. This dividing method making use of a laser beam processing is to divide a plate-like workpiece by applying a laser beam having an infrared range, which can pass through the plate-like workpiece, with its converging point on the inside thereof from one surface side of the plate-like workpiece so as to continuously form a deteriorated layer in the inside of the plate-like workpiece along dividing lines and applying external force along the dividing lines whose strength has been reduced due to the formation of the deteriorated layer, as disclosed by JP-A 2002-192367, for example.

However, as the dividing method disclosed by the above publication needs a dividing step for dividing the plate-like workpiece by exerting external force on the plate-like workpiece, it has a problem that an additional dividing step increases as compared with the dividing method for cutting with a cutting machine, thereby reducing productivity. Further, the above dividing method involves another problem that, as the dividing step is carried out in a state of the plate-like workpiece being put on a protective tape affixed to an annular frame, there is almost no gap between the chips so that the chips come into contact with one another to suffer damage when they are carried to a pick-up step where they are picked up from the protective tape affixed to the annular frame and die-bonded.

SUMMARY OF THE INVENTION

It is an object of the present invention to provide a plate-like workpiece dividing apparatus which can divide a plate-like workpiece having reduced strength along dividing lines efficiently and can pick up the divided chips without damaging them.

To attain the above object, according to the present invention, there is provided a dividing apparatus for dividing a plate-like workpiece that is put on the top surface of a protective tape affixed to an annular frame and has reduced strength along dividing lines, along the dividing lines, comprising:

a frame holding means for holding the annular frame;

a tape expansion means for expanding the protective tape affixed to the annular frame held on the frame holding means;

a detection means for detecting the plate-like workpiece put on the protective tape;

a dividing mean for pressing the dividing lines detected by the detection means, of the plate-like workpiece, via the protective tape to divide the plate-like workpiece into chips along the dividing lines;

a pushing-up means for pushing up the divided chips through the protective tape; and a pick-up means for picking up the chip pushed up by the pushing-up means.

The above tape expansion means comprises an expansion drum having an inner diameter smaller than the inner diameter of the annular frame and an outer diameter larger than the outer diameter of the plate-like workpiece and an expansion moving means for moving the expansion drum and the frame holding means relative to each other in a vertical direction, and causes the upper edge of the expansion drum to act on the protective tape.

Preferably, the above dividing means comprises a pressing member for pressing the dividing lines of the plate-like workpiece through the protective tape and a pressing and moving means for moving the pressing member toward, or away from, the plate-like workpiece; and the pushing-up means comprises a pushing-up member for pushing up the chips through the protective tape and a pushing-up and moving means for moving the pushing-up member toward, or away from, the plate-like workpiece. The above pressing member and the above trusting member are constituted by a pressing and pushing-up member which has a pressing portion at one end and a trusting portion at the other end and can change its working position selectively, and the above pressing and moving means and the above pushing-up and moving means are constituted by a common moving means for moving the pressing and pushing-up member toward, or away from, the plate-like workpiece.

Preferably, the plate-like workpiece dividing apparatus comprises a first moving means for moving the frame holding means and the tape expansion means relative to the dividing means and the pushing-up means in a predetermined direction, and a second means for moving the frame holding means and the tape expansion means relative to the dividing means and the pushing-up means in a direction perpendicular to the predetermined direction. Preferably, the plate-like workpiece dividing apparatus comprises a turning means for turning the frame holding means and the tape expansion means relative to the dividing means and the pushing-up means.

DETAILED DESCRIPTION OF THE PREFERRED EMBODIMENTS

A preferred embodiment of a plate-like workpiece dividing apparatus constituted according to the present invention will be described in detail hereinunder with reference to the accompanying drawings.

Figure 10:
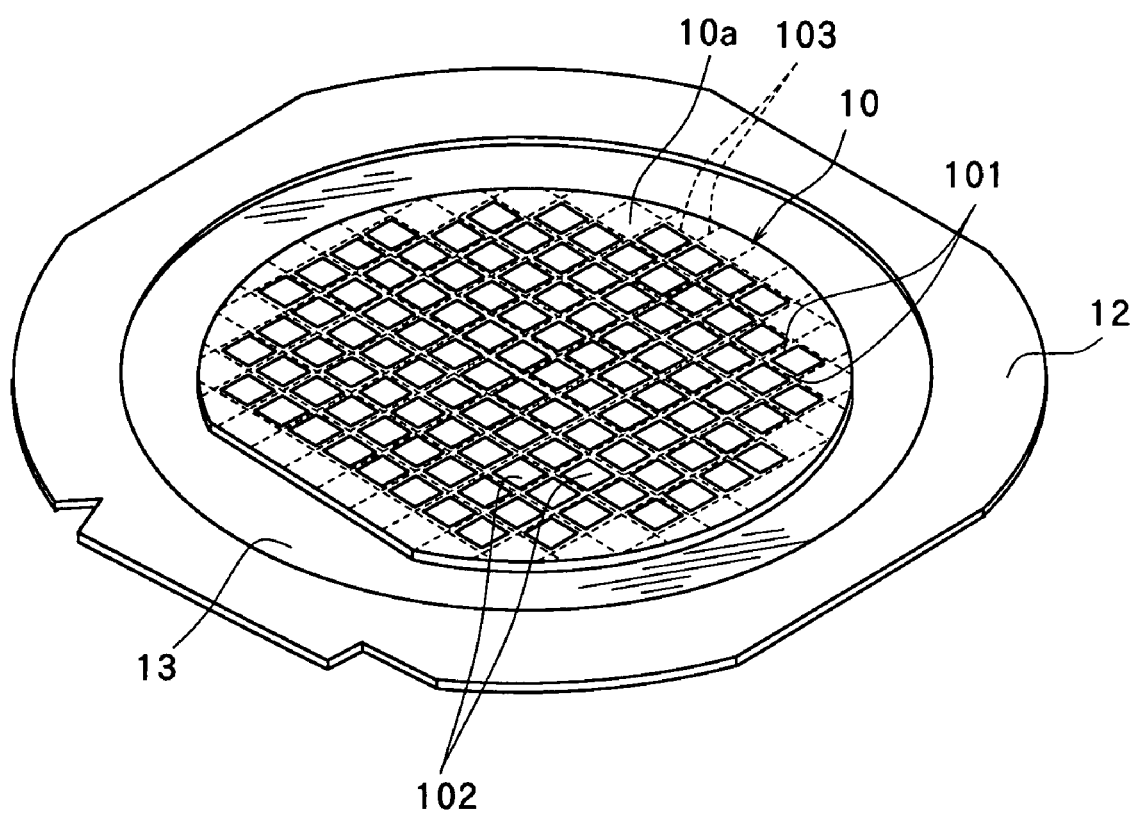
FIG. 10 is a perspective view showing a state of a plate-like workpiece having reduced strength along the dividing lines being put on a protective tape affixed to an annular frame.

To divide a plate-like workpiece having reduced strength along dividing lines, the plate-like workpiece 10 is supported on an annular frame 12 by putting it on the top surface of a protective tape 13 affixed to the annular frame 12 with its front surface 10a facing up, as shown in FIG. 10. Here, a step of putting the plate-like workpiece 10 having reduced strength along the dividing lines on the top surface of the protective tape 13 affixed to the annular frame 12 will be described with reference to FIGS. 11(a) to 11(c).

Figure 11:
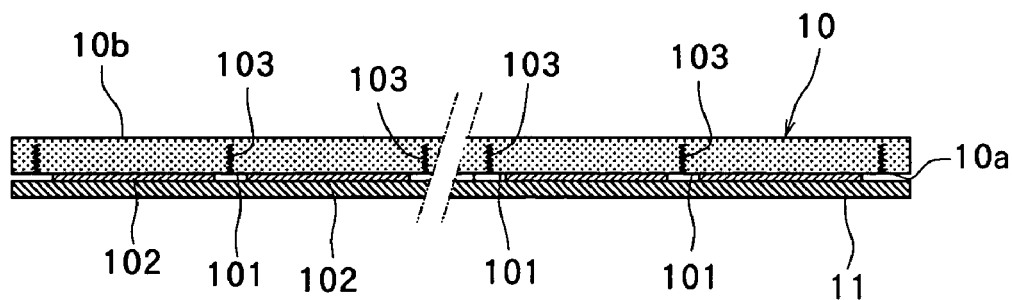
FIGS. 11(a) to 11(c) are diagrams explaining the step in which the plate-like workpiece having reduced strength along the dividing lines is put on the protective tape affixed to the annular frame.
Figure 11:
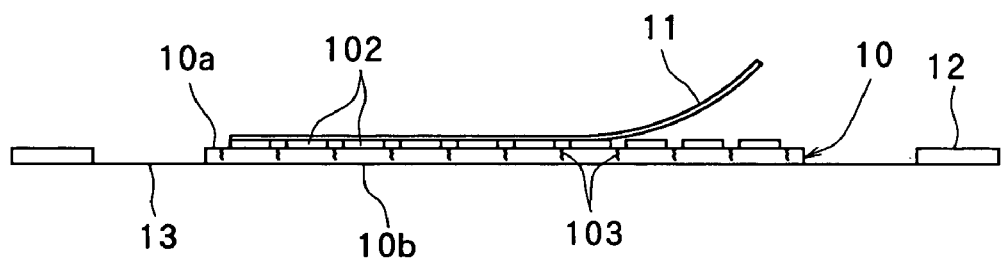
Figure 11:
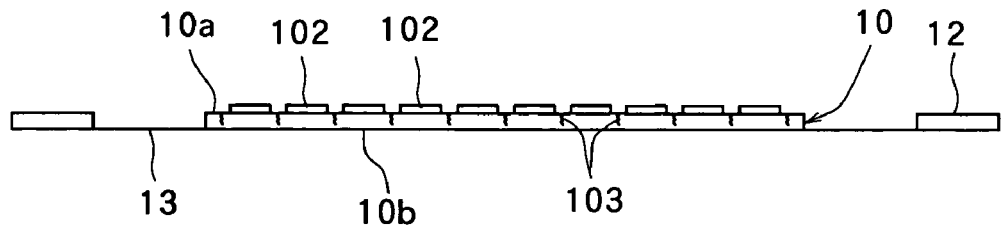

The plate-like workpiece 10 in the illustrated embodiment is a semiconductor wafer that has a plurality of dividing lines 101 formed on the front surface 10a in a lattice-like form and circuits 102 formed in a plurality of areas sectioned by the plurality of dividing lines 101 as shown in FIG. 10 and FIG. 11(a). A protective member 11 is affixed onto the front surface 10a of the plate-like workpiece 10 as shown in FIG. 11(a), and a pulse laser beam is applied to the plate-like workpiece 10 with its converging point on the inside thereof from its back surface 10b along the dividing lines 101 to form deteriorated layers 103 exposed to the front surface 10a. The strength of the plate-like workpiece 10 is reduced along the dividing lines 101 by forming the deteriorated layers 103. The plate-like workpiece 10 whose strength has been thus reduced along the dividing lines 101 is put on the protective tape 13 in such a manner that the back surface 10b side comes into contact with the top surface of the protective tape 13 as shown in FIG. 11(b). And, by removing the protective member 11 affixed onto the front surface 10a of the plate-like workpiece 10, the plate-like workpiece 10 which has the deteriorated layers 103 and reduced strength along the dividing lines 101 is put on the top surface of the protective tape 13 affixed to the annular frame 12, with the front surface 10a facing up as shown in FIG. 11(c).

Next, the apparatus for dividing the above-described plate-like workpiece 10 along the dividing lines 101 will be described with reference to FIGS. 1 to 9.

Figure 1:
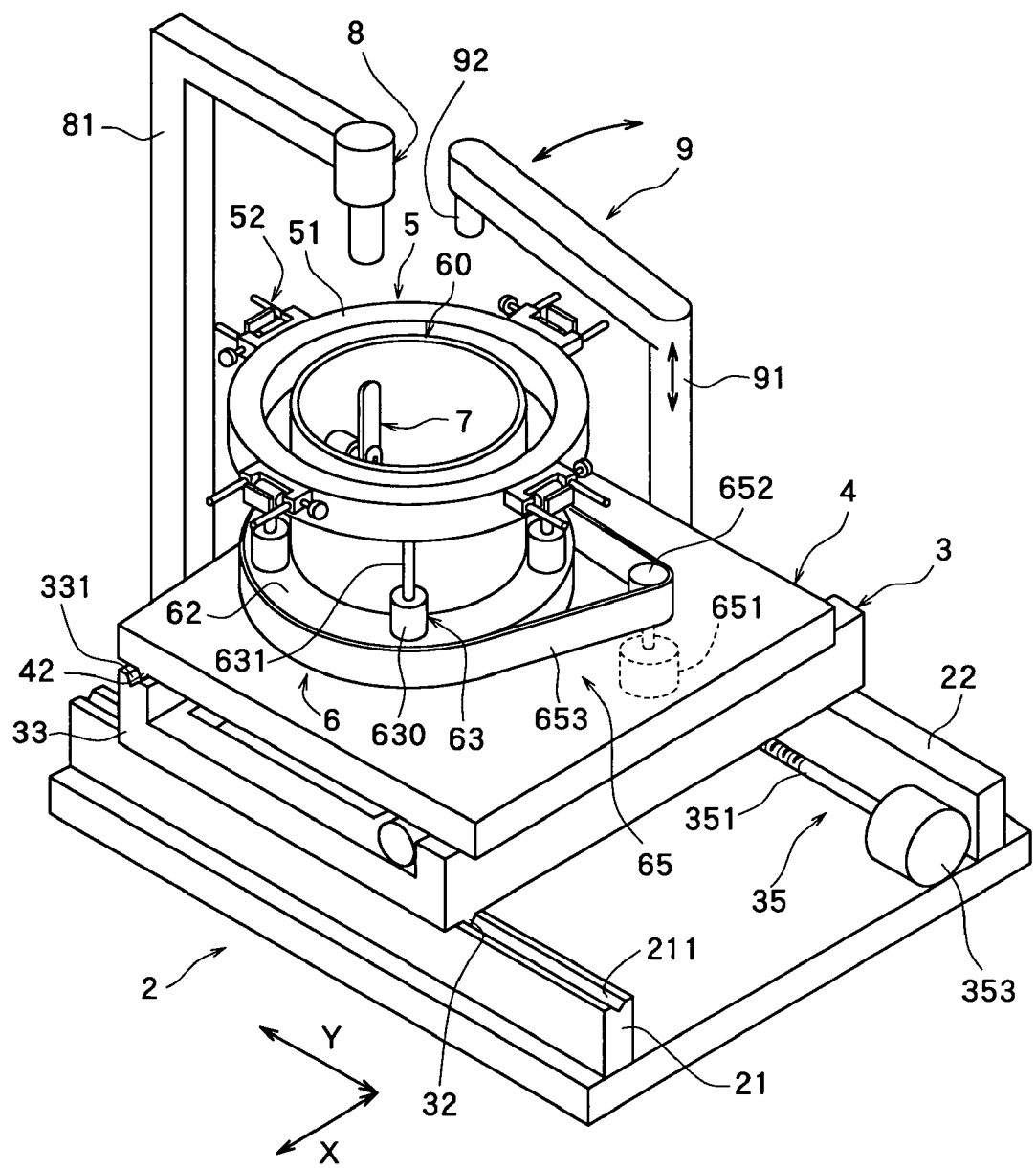
FIG. 1 is a perspective view of a plate-like workpiece dividing apparatus constituted according to the present invention.
Figure 2:
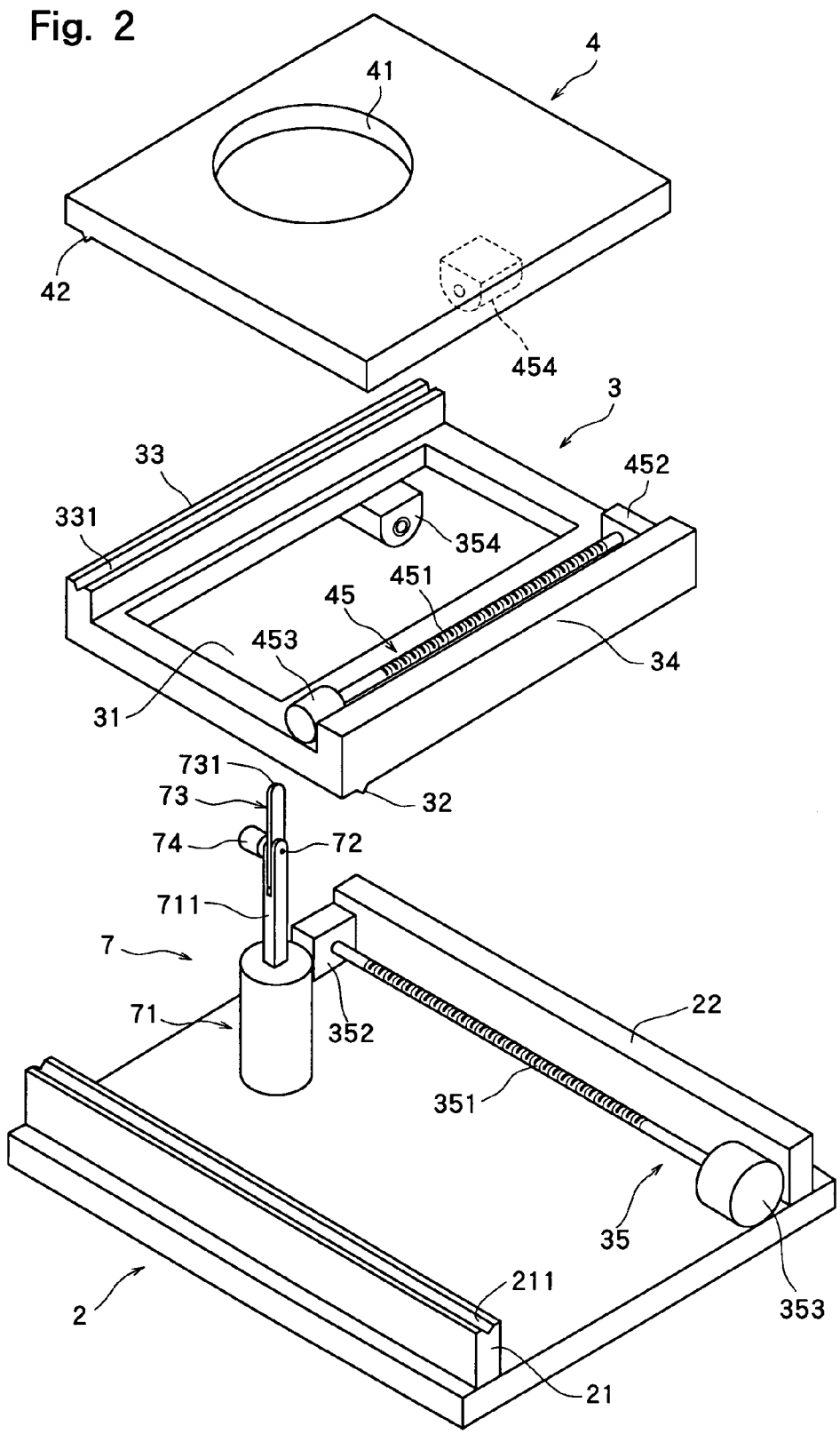
FIG. 2 is an exploded perspective view of a base, first table and second table constituting the dividing apparatus shown in FIG. 1.

FIG. 1 is a perspective view of a plate-like workpiece dividing apparatus constituted according to the present invention, and FIG. 2 is an exploded perspective view of the principal section of the dividing apparatus. The dividing apparatus in the illustrated embodiment comprises a base 2, a first table 3 arranged on the base 2 in such a manner that it can move in a direction indicated by an arrow Y, and a second table 4 which is arranged on the first table 3 in such a manner that it can move in a direction indicated by an arrow X perpendicular to the direction indicated by the arrow Y.

The base 2 is formed in a rectangular shape and is provided on respective side portions of its top surface with two guide rails 21 and 22 that are arranged parallel to each other in the direction indicated by the arrow Y. A guide groove 211 having a V-shaped section is formed in the top surface of the guide rail 21 out of the two guide rails.

The above first table 3 is shaped like a window frame having a rectangular opening 31 at the center as shown in FIG. 2. A to-be-guided rail 32 that is slidably fitted to the guide groove 211 formed in the guide rail 21 on the above described base 2 is formed on the under surface of one side portion of the first table 3. Two guide rails 33 and 34 perpendicular to the above guide rail 32 are formed parallel to each other on the top surfaces of both side portions of the first table 3. A guide groove 331 having a V-shaped section is formed in one guide rail 33 out of the two guide rails. In the first table 3 thus constituted, as shown in FIG. 1, the to-be-guided rail 32 is fitted to the guide groove 211 formed in the guide rail 21 on the base 2, and the under surface of the other side portion of the first table 3 is placed on the other guide rail 22 on the base 2. The plate-like workpiece dividing apparatus in the illustrated embodiment comprises a first moving means 35 for moving the first table 3 along the guide rails 21 and 22 on the base 2 in the direction indicated by the arrow Y. As shown in FIG. 2, this first moving means 35 comprises a male screw rod 351 arranged parallel to the other guide rail 22 on the base 2, a bearing 352 that is arranged on the base 2 and rotatably supports one end of the male screw rod 351, a pulse motor 353 that is connected with the other end of the male screw rod 351 and rotationally drives the male screw rod 351, and a female screwblock 354 that is formed on the under surface of the above first table 3 to be screwed with the male screw rod 351. The first moving means 35 thus constituted moves the first table 3 in the direction indicated by the arrow Y when the male screw rod 351 is turned by driving the pulse motor 353.

The above described second table 4 is formed in a rectangular shape and has a circular hole 41 at the center as shown in FIG. 2. A guide rail 42 to be slidably fitted to the guide groove 331 formed in the guide rail 33 on the first table 3 is formed on the under surface of one side portion of the second table 4. As shown in FIG. 1, the to-be-guided rail 42 of the second table 4 thus constituted is mated with the guide groove 331 formed in the guide rail 33 on the first table 3 and the under surface of the other side portion of the second table 4 is placed on the other guide rail 34 on the first table 3. The plate-like workpiece dividing apparatus in the illustrated embodiment has a second moving means 45 for moving the second table 4 along the guide rails 33 and 34 on the first table 3 in the direction indicated by the arrow X. As shown in FIG. 2, this second moving means 45 comprises a male screw rod 451 arranged parallel to the other guide rail 34 on the first table 3, a bearing 452 that is arranged on the first table 3 and rotatably supports one end of the male screw rod 451, a pulse motor 453 that is connected with the other end of the male screw rod 451 and rotationally drives the male screw rod 451, and a female screw block 454 that is formed on the under surface of the above second table 4 and is screwed with the male screw rod 451. The second moving means 45 thus constituted moves the second table 4 in the direction indicated by the arrow X when the male screw rod 451 is turned by driving the pulse motor 453.

Figure 3:
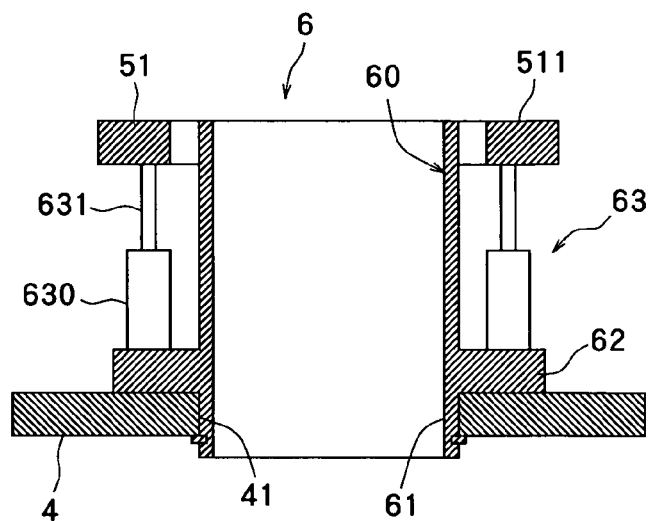
FIG. 3 is a sectional view of the second table, frame holding means and tape expansion means constituting the dividing apparatus shown in FIG. 1.

As shown in FIG. 1, the plate-like workpiece dividing apparatus in the illustrated embodiment comprises a frame holding means 5 for holding the annular frame 12 and a tape expansion means 6 for expanding the protective tape 13 affixed to the annular frame 12 held on the frame holding means 5. The frame holding means 5 comprises an annular frame holding member 51 having an inner diameter larger than the diameter of the hole 41 formed in the above second table 4 and a plurality of clamps 52 as a fixing means arranged at the outer periphery of the frame holding member 51 as shown in FIG. 1 and FIG. 3. The top surface of the frame holding member 51 serves as a placing surface 511 for placing the annular frame 12, and the annular frame 12 is placed on the placing surface 511. The annular frame 12 placed on the placing surface 511 is secured to the frame holding member 51 by the clamps 52. The frame holding means 5 thus constituted is situated above the hole 41 of the second table 4 and supported by the tape expansion means 6 to be described later such that it can move in the vertical direction.

The tape expansion means 6 has an expansion drum 60 arranged at the inside of the above annular frame holding member 51 as shown in FIG. 1 and FIG. 3. This expansion drum 60 has an inner diameter smaller than the inner diameter of the annular frame 12 and an outer diameter larger than the outer diameter of the plate-like workpiece 10 to be put on the protective tape 13 affixed to the annular frame 12. Further, the expansion drum 60 has a mounting portion 61 which is turnably fitted to the inner wall of the hole 41 formed in the above second table 4 at its lower end and a support flange 62 projecting in the radial direction from its outer wall above the mounting portion 61. The tape expansion means 6 in the illustrated embodiment has a support means 63 that can move the annular frame holding member 51 in the vertical direction. This support means 63 comprises a plurality of air cylinders 630 installed on the above support flange 62, and their piston rods 631 are connected to the under surface of the above annular frame holding member 51. The support means 63 thus comprising the plurality of air cylinders 630 moves the annular frame holding member 51 to a standard position where the placing surface 511 becomes substantially flush with the upper end of the expansion drum 60 and to an expansion position where it is positioned below the upper end of the expansion drum 60 by a predetermined distance in the vertical direction. Therefore, the support means 63 comprising the plurality of air cylinders 630 functions as an expansion moving means for moving the expansion drum 60 and the frame holding member 51 relative to each other in the vertical direction.

The plate-like workpiece dividing apparatus in the illustrated embodiment has a turning means 65 for turning the above expansion drum 60 and the frame holding member 51 as shown in FIG. 1. This turning means 65 comprises a pulse motor 651 installed under the above second table 4, a belt pulley 652 mounted on the rotary shaft of the pulse motor 651, and an endless belt 653 wound round the belt pulley 652 and the support flange 62 of the expansion drum 60. The turning means 65 thus constituted turns the expansion drum 60 via the belt pulley 652 and the endless belt 653 by driving the pulse motor 651.

Figure 4:
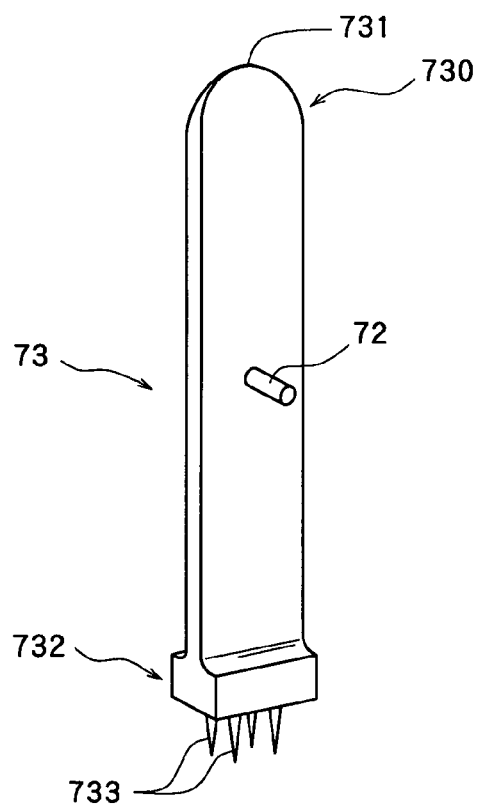
FIG. 4 is an enlarged perspective view of an example of a pressing and pushing-up member constituting the dividing apparatus shown in FIG. 1.

The plate-like workpiece dividing apparatus in the illustrated embodiment comprises a dividing and pushing-up means 7 for dividing the plate-like workpiece 10 supported to the annular frame 12 held on the above annular frame holding member 51 via the protective tape 13 into individual chips along the dividing lines 101 and pushing up the divided chips. This dividing and pushing-up means 7 is mounted on the above base 2 and installed in the expansion drum 60. As shown in FIG. 2, this dividing and pushing-up means 7 comprises an air cylinder 71 disposed on the base 2, a pressing and pushing-up member 73 having an intermediate portion turnably supported to the piston rod 711 of the air cylinder 71 by a rotary shaft 72, and a 180° turning rotor 74 for turning the rotary shaft 72. As shown in FIG. 4, the pressing and pushing-up member 73 has, at one end, a pressing portion 730 having an arc shape 731 in a direction perpendicular to the rotary shaft 72 and has, at the other end, a pushing-up portion 732 having a plurality of needles 733. The dividing and pushing-up means 7 thus constituted brings the pressing and pushing-up member 73 to a dividing position where the pressing portion 731 is located at the upper position and to a pushing-up position where the pushing-up portion 732 is located at the upper position as shown in FIG. 1 and FIG. 2 by operating the 180° turning rotor 74. Further, in a state of the pressing and pushing-up member 73 being brought to a dividing work position, the dividing and pushing-up means 7 activates the air cylinder 71 to bring the pressing and pushing-up member 73 to a dividing position which will be described later to press a dividing line 101 of the plate-like workpiece 10. Therefore, the air cylinder 71 functions as a pressing and moving means for moving the pressing and pushing-up member 73 toward, or away from, the plate-like workpiece. Further, in a state of the pressing and pushing-up member 73 being brought to a pushing-up work position, the dividing and pushing-up means 7 activates the air cylinder 71 to bring the pressing and pushing-up member 73 to a pushing-up position which will be described later to push up a chip obtained by dividing the plate-like workpiece 10 along the dividing lines 101 via the protective tape 13. Therefore, the air cylinder 71 functions as a pushing-up and moving means for moving the pressing and pushing-up member 73 toward, or away from, the plate-like workpiece.

A description is subsequently given of another example of the pressing portion 730 of the pressing and pushing-up member 73 with reference to FIGS. 5 to 7.

Figure 5:
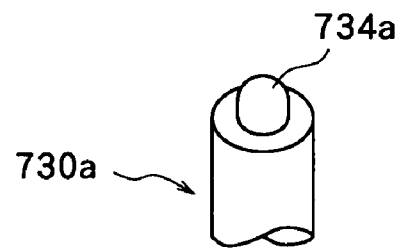
FIG. 5 is a perspective view of the pressing portion of another example of the pressing and pushing-up member constituting the dividing apparatus shown in FIG. 1.

The pressing portion 730a of the pressing and pushing-up member 73 in the embodiment shown in FIG. 5 has a spherical end portion 734a. The radius of the spherical end portion 734a is set to be 1 to 2 mm. By forming the spherical end portion 734a of the pressing portion 730a, the relative movement direction of the plate-like workpiece 10 along the dividing lines 101 is not limited.

Figure 6:
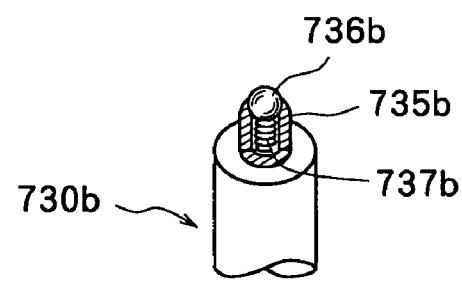
FIG. 6 is a perspective view of the pressing portion of still another example of the pressing and pushing-up member constituting the dividing apparatus shown in FIG. 1.

The pressing portion 730b of the pressing and pushing-up member 73 in the embodiment shown in FIG. 6 comprises a ball case 735b, a steel ball 736b installed in the ball case 635b, and a coil spring 737b interposed between the ball 736b and the bottom of the ball case 735b. The radius of the ball 736b is set to be 1 to 2 mm. By using the ball 736b in the pressing portion 730b, the relative movement direction of the plate-like workpiece 10 along the dividing lines 101 is not limited and the relative movement of the plate-like workpiece 10 becomes smooth because the ball 736b rolls at the time of relative movement.

Figure 7:
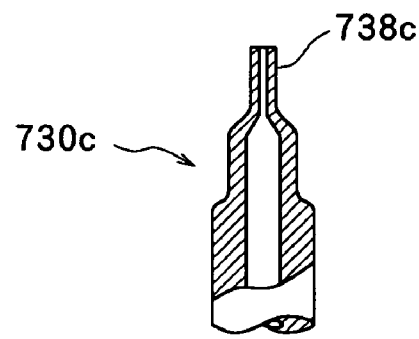
FIG. 7 is a perspective view of the pressing portion of a further example of the pressing and pushing-up member constituting the dividing apparatus shown in FIG. 1.
Figure 8:
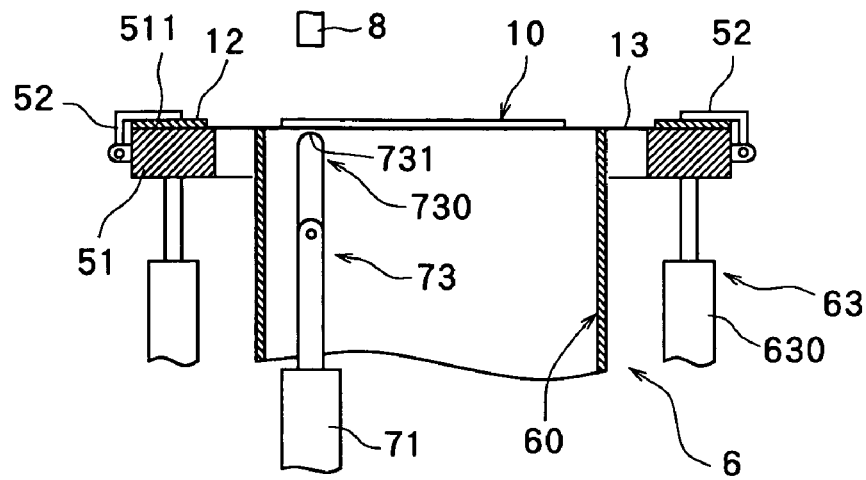
FIGS. 8(a) and 8(b) are diagrams for explaining the dividing work of the dividing apparatus shown in FIG. 1.
Figure 8:
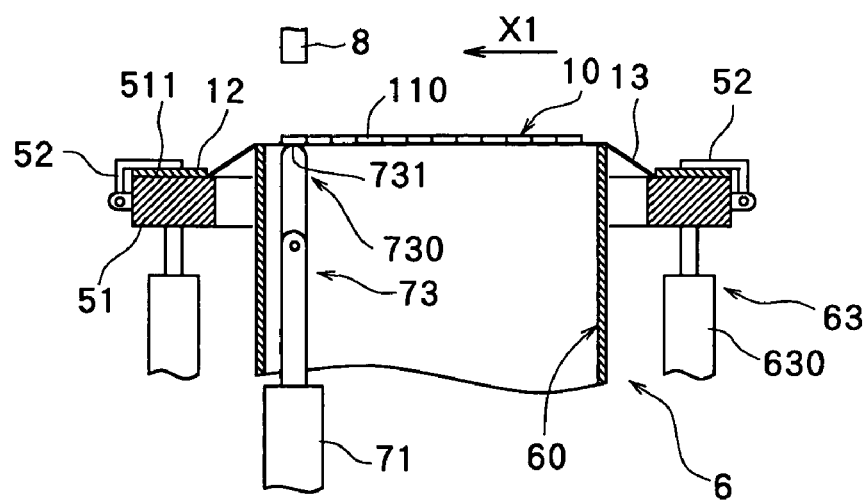
Figure 9:
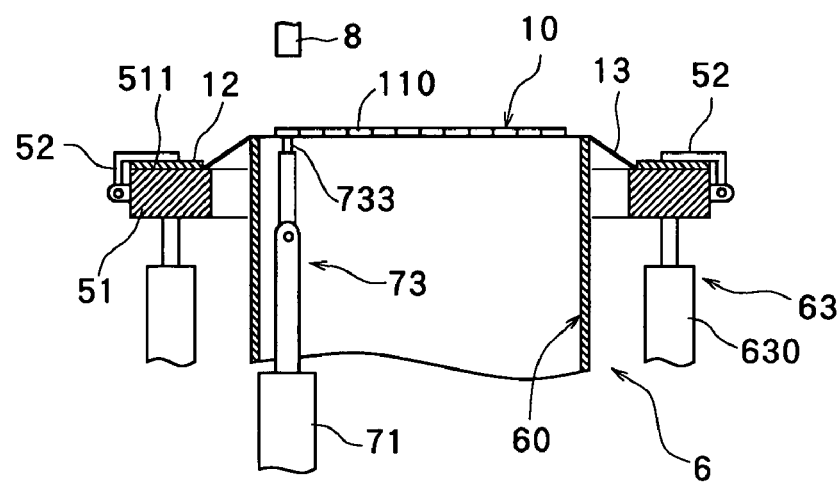
FIGS. 9(a) and 9(b) are diagrams for explaining the pick-up work of the dividing apparatus shown in FIG. 1.
Figure 9:
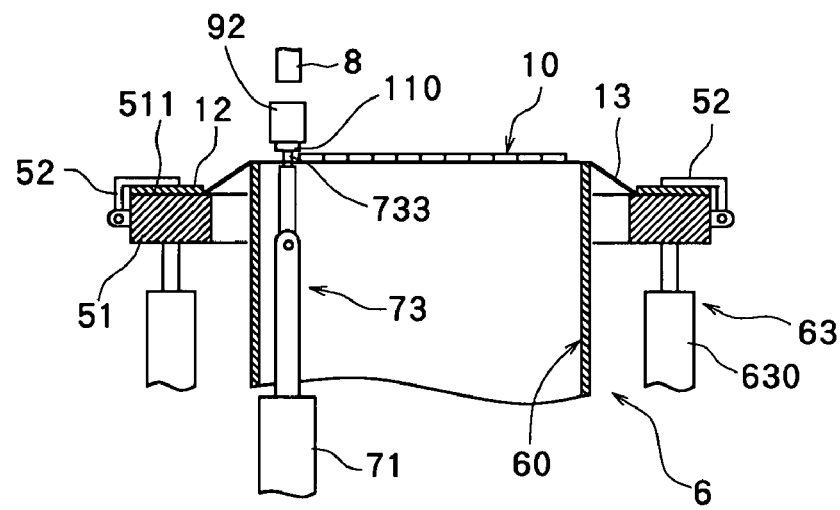

The pressing portion 730c of the pressing and pushing-up member 73 in the embodiment shown in FIG. 7 has an air nozzle 738c. The air ejection port of the air nozzle 738c has an inner diameter of about 1 mm. Since this embodiment makes use of air pressure, the relative movement direction of the plate-like workpiece 10 along the dividing lines 101 is not limited and the relative movement of the plate-like workpiece 10 becomes smooth because there is no mechanical contact.

The above dividing and pushing-up means 7 is so constituted as to serve as dividing means having a dividing function and as a pushing-up means having a pushing-up function in combination, but it may be so constituted as to have the dividing means and the pushing-up means separately.

Returning to FIG. 1, the plate-like workpiece dividing apparatus in the illustrated embodiment comprises a detection means 8 for detecting the dividing lines 101 of the plate-like workpiece 10 supported on the annular frame 12 held on the above annular frame holding member 51 via the protective tape 13 and the individually divided chip, which will be described later. The detection means 8 is attached to an L-shaped support pole 81 installed on the base 2. This detection means 8 comprises an optical system and an image pick-up device (CCD) or the like, and is located above the pressing and pushing-up member 73 constituting the above dividing and pushing-up means 7. The detection means 8 thus constituted takes images of a dividing line 101 of the plate-like workpiece 10 supported on the annular frame 12 held on the above annular frame holding member 51 through the protective tape 13 and the later-described individually divided chip and then, converts the obtained image signal into an electric signal to transmit it to a control means that is not shown.

The plate-like workpiece dividing apparatus in the illustrated embodiment comprises a pick-up means 9 for picking up a chip pushed up by the above pressing and pushing-up member 73, from the protective tape 13. This pick-up means 9 comprises a turning arm 91 installed on the base 2 and a pick-up collet 92 attached to the end of the arm 91. The turning arm 91 is turned by a drive means that is not shown. The turning arm 91 can move vertically, and the pick-up collet 92 attached to the end of the turning arm 91 moves on loci, which passes above the pressing and pushing-up member 73 and below the above detection means 8. Therefore, when the pick-up collet 92 is positioned above the above pressing and pushing-up member 73, it can pick up a chip pushed up by the pressing and pushing-up member 73.

The plate-like workpiece dividing apparatus in the illustrated embodiment is constituted as described above, and its operation will be described with reference to FIG. 1 and FIGS. 8(a) and 8(b) mainly.

The annular frame 12 supporting the plate-like workpiece 10 having reduced strength along the dividing lines 101 via the protective tape 13 as shown in FIG. 10 is placed on the placing surface 511 of the frame holding member 51 constituting the frame holding means 5 as shown in FIG. 8(a) and fixed on the frame holding member 51 by the clamps 52. At this point, the frame holding member 51 is at the standard position shown in FIG. 8(a).

After the annular frame 12 holding the plate-like workpiece 10 through the protective tape 13 is held on the frame holding member 51, the plurality of air cylinders 630 as a support means 63 constituting the tape expansion means 6 are activated to lower the annular frame holding member 51 to the expansion position shown in FIG. 8(b). As a result, the annular frame 12 fixed on the placing surface 511 of the frame holding member 51 is also lowered, whereby the protective tape 13 affixed to the annular frame 12 comes into contact with the upper edge of the expansion drum 60 and expanded as shown in FIG. 8(b).

Thereafter, image processing such as pattern matching is carried out by the detection means 8 and the control means (not shown) to align a dividing line 101 formed on the plate-like workpiece 10 with the pressing portion 730 of the pressing and pushing-up member 73. The alignment of the dividing position is thus carried out.

The first moving means 35 and the second moving means 45 are then activated to move the first table 3 in the direction indicated by the arrow Y and the second table 4 in the direction indicated by the arrow X to bring a predetermined dividing line 101 formed on the plate-like workpiece 10 to a position corresponding to the pressing portion 730 of the pressing and pushing-up member 73. At this point, the pressing portion 730 of the pressing and pushing-up member 73 is located at the upper position. Thereafter, the air cylinder 71 is activated to move up the pressing and pushing-up member 73 and press the pressing portion 730 against the predetermined dividing line 101 formed on the plate-like workpiece 10 via the protective tape 13. Then, the second moving means 45 is activated to move the second table 4 in the direction indicated by the arrow X. Therefore, as the frame holding member 51 and the tape expansion means 6 installed on the second table 4 move in the direction shown by an arrow X1 in FIG. 8(b), they make a relative movement to the pressing portion 730 while the pressing portion 730 presses the plate-like workpiece 10 along the predetermined dividing line 101 (dividing step). As a result, the plate-like workpiece 10 is easily divided along the dividing line 101 because its strength has been reduced along the dividing line 101. After the step of dividing the plate-like workpiece 10 along the predetermined dividing line is carried out, the first moving means 35 is activated to indexing-move the second table 4 by the interval between the dividing lines 101 in the direction indicated by the arrow Y (indexing step) to carry out the above dividing step. After the dividing step and the indexing step are thus carried out for all the dividing lines 101 extending in the predetermined direction, the above pulse motor 651 is activated to turn the expansion drum 60 and the frame holding member 51 at 90°, and the above dividing step and the indexing step for dividing lines 101 extending in a direction perpendicular to the above predetermined direction are carried out, thereby dividing the plate-like workpiece 10 into individual chips 110 along the dividing lines 101.

After the plate-like workpiece 10 is divided into the individual chips 110 along the dividing lines 101, the pick-up work for picking up the individually divided chip 110 is carried out.

That is, the 180° turning rotor 74 is activated to invert the pressing portion 730 and pushing-up portion 732 of the pressing and pushing-up member 73 at 180° to bring the pushing-up portion 732 to a working position. Image processing such as pattern matching is then carried out by the detection means 8 and the control means (not shown) to align a chip 110 individually divided as described above with the pushing-up portion 732 of the pressing and pushing-up member 73, thereby performing the alignment of the pick-up position.

Thereafter, the first moving means 35 and the second moving means 45 are activated to move the first table 3 in the direction indicated by the arrow Y and the second table 4 in the direction indicated by the arrow X to bring a predetermined chip 110 to a position corresponding to the pushing-up portion 732 of the pressing and pushing-up member 73 as shown in FIG. 9(a). At this point, the pushing-up portion 732 of the pressing and pushing-up member 73 is located at the upper position. Thereafter, the air cylinder 71 is activated to move up the pressing and pushing-up member 73 to push up the chip 110 with the plurality of needles 733 of the pushing-up portion 732 through the protective tape 13 as shown in FIG. 9(b). After the predetermined chip is thus pushed up, the pick-up means 9 is activated to pick up the chip 110 by the pick-up collet 92 and transfer it to a die bonding area that is not shown. Other chips 110 are each also brought to a position corresponding to the pushing-up portion 732 of the pressing and pushing-up member 73 one by one to carry out the above pick-up work.

As described above, in the plate-like workpiece dividing apparatus of the present invention, the dividing work is carried out along the dividing lines formed on the plate-like workpiece and the pick-up work for picking up divided chip is carried out in a state where the dividing work has been performed, thereby making it possible to improve the work efficiency. Further, since the plate-like workpiece dividing apparatus in the illustrated embodiment can carry out the chip pick-up work in a state where the dividing work has been performed, a problem that adjacent chips come in contact with each other to be damaged at the time when they are transferred to the pick-up step can be prevented.

We claim:

1. A dividing apparatus for dividing a plate-like workpiece along dividing lines of the workpiece, the workpiece being on the top surface of a protective tape affixed to an annular frame and having reduced strength along its dividing lines, said apparatus comprising:
    a frame holding means for holding the annular frame;
    a tape expansion means for expanding the protective tape affixed to the annular frame held on the frame holding means;
    a detection means for detecting the dividing lines of the plate-like workpiece on the protective tape;
    a dividing means for pressing the dividing lines detected by the detection means via the protective tape to divide the plate-like workpiece into chips along the dividing lines;
    a pushing-up means for pushing up the divided chips through the protective tape; and
    a pick-up means for picking up the chips pushed up by the pushing-up means.

2. The plate-like workpiece dividing apparatus according to claim 1,
    wherein the tape expansion means comprises an expansion drum having a diameter for fitting within an inner diameter of the annular frame and an expansion moving means for moving the expansion drum and the frame holding means relative to each other in a vertical direction and for causing an upper edge of the expansion drum to act on the protective tape.

3. The plate-like workpiece dividing apparatus according to claim 1,
    wherein the dividing means comprises a pressing portion for pressing the dividing lines of the plate-like workpiece through the protective tape, and a pressing and moving means for moving the pressing portion toward, or away from, the plate-like workpiece, and
    wherein the pushing-up means comprises a pushing-up portion for pushing up the chips through the protective tapes and the pressing and moving means for moving the pushing-up portion toward, or away from, the plate-like workpiece.

4. The plate-like workpiece dividing apparatus according to claim 3,
    wherein the pressing portion and the pushing-up portion are constituted by a pressing and pushing-up member which has the pressing portion at one end and the pushing-up portion at the other end and can change its working position selectively, and
    wherein the pressing and moving means is for moving the pressing and pushing-up member toward, or away from, the plate-like workpiece.

5. The plate-like workpiece dividing apparatus according to claim 1, which comprises:
    a first moving means for moving the frame holding means and the tape expansion means relative to the dividing means and the pushing-up means in a predetermined direction, and
    a second moving means for moving the frame holding means and the tape expansion means relative to the dividing means and the pushing-up means in a direction perpendicular to the predetermined direction.

6. The plate-like workpiece dividing apparatus according to claim 1, which comprises a turning means for turning the frame holding means and the tape expansion means relative to the dividing means and the pushing-up means.

* * * * *